(12) United States Patent
Axenbeck et al.

(10) Patent No.: US 7,640,120 B2
(45) Date of Patent: Dec. 29, 2009

(54) METHOD AND DEVICE FOR DETECTING ARCS

(75) Inventors: Sven Axenbeck, Neuenburg (DE);
Markus Bannwarth, Freiburg (DE);
Martin Steuber, Buggingen (DE); Peter Wiedemuth, Herbolzheim (DE); Lothar Wolf, Sasbach (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 427 days.

(21) Appl. No.: 11/612,655

(22) Filed: Dec. 19, 2006

(65) Prior Publication Data
US 2007/0168143 A1 Jul. 19, 2007

(30) Foreign Application Priority Data
Dec. 22, 2005 (EP) .................. 05028145

(51) Int. Cl.
*G06F 19/00* (2006.01)
*G01R 31/00* (2006.01)

(52) U.S. Cl. .............. 702/58; 324/510; 361/1; 361/2; 361/35; 361/42; 361/62; 361/65; 361/78; 361/79; 700/292; 700/293; 702/57; 702/187; 702/188; 702/189

(58) Field of Classification Search ........... 324/500, 324/509, 510, 522; 361/1, 2, 35, 36, 37, 361/42, 45, 54, 56, 57, 62, 63, 65, 78, 79, 361/86, 87, 88, 90, 91.1, 92, 93.1, 93.2, 93.9, 361/102; 700/292, 293; 702/1, 57, 58, 64, 702/127, 187, 188, 189
See application file for complete search history.

(56) References Cited

U.S. PATENT DOCUMENTS

| | | | |
|---|---|---|---|
| 4,031,464 A | 6/1977 | Norberg | |
| 4,396,478 A | 8/1983 | Aizenshtein et al. | |
| 4,625,283 A | 11/1986 | Hurley | |
| 4,694,402 A | 9/1987 | McEachern et al. | |
| 4,936,960 A | 6/1990 | Siefkes et al. | |
| 5,192,894 A | 3/1993 | Teschner | |
| 5,241,152 A | 8/1993 | Anderson et al. | |
| 5,611,899 A | 3/1997 | Maass | |
| 5,698,082 A * | 12/1997 | Teschner et al. | 204/298.03 |
| 5,718,813 A | 2/1998 | Drummond et al. | |

(Continued)

FOREIGN PATENT DOCUMENTS

| | | |
|---|---|---|
| DE | 4127504 | 2/1993 |
| DE | 43 26 100 | 2/1995 |
| DE | 44 20 951 | 12/1995 |
| DE | 19651615 | 7/1997 |
| DE | 19848636 | 5/2000 |

(Continued)

OTHER PUBLICATIONS

Ochs et al., "Advanced Power Supplies designed for Plasma Deposition and Etching", Vakuum In Forschung und Praxis, vol. 8, No. 5, Sep. 26, 2006, pp. 32-36.

(Continued)

*Primary Examiner*—Edward R Cosimano
(74) *Attorney, Agent, or Firm*—Fish & Richardson P.C.

(57) ABSTRACT

An arc detection means for detecting arcs in a plasma process includes at least one comparator to which an evaluation signal such as an output signal or an internal signal of an AC generator relating to the output signal and a reference value are supplied. The comparator is connected to a logic component that generates a signal for an arc suppression device.

29 Claims, 2 Drawing Sheets

U.S. PATENT DOCUMENTS

| | | | |
|---|---|---|---|
| 5,993,615 | A | 11/1999 | Abry et al. |
| 6,007,879 | A | 12/1999 | Scholl |
| 6,063,245 | A | 5/2000 | Frach et al. |
| 6,162,332 | A | 12/2000 | Chiu |
| 6,332,961 | B1 | 12/2001 | Johnson et al. |
| 6,416,638 | B1 | 7/2002 | Kuriyama et al. |
| 6,420,863 | B1 | 7/2002 | Milde et al. |
| 6,535,785 | B2 | 3/2003 | Johnson et al. |
| 6,621,674 | B1 | 9/2003 | Zahringer et al. |
| 6,736,944 | B2 | 5/2004 | Buda |
| 6,740,207 | B2 | 5/2004 | Kloeppel et al. |
| 6,753,499 | B1 | 6/2004 | Yasaka et al. |
| 6,783,795 | B2 | 8/2004 | Inoue et al. |
| 6,878,248 | B2 | 4/2005 | Signer et al. |
| 6,943,317 | B1 | 9/2005 | Ilic et al. |
| 6,967,305 | B2 | 11/2005 | Sellers |
| 7,016,172 | B2 * | 3/2006 | Escoda ............ 361/42 |
| 7,081,598 | B2 | 7/2006 | Ilic et al. |
| 7,262,606 | B2 * | 8/2007 | Axenbeck et al. ........ 324/536 |
| 7,301,286 | B2 | 11/2007 | Kuriyama |
| 7,408,750 | B2 * | 8/2008 | Pellon et al. ............ 361/42 |
| 2004/0031699 | A1 | 2/2004 | Shoji |
| 2004/0182697 | A1 | 9/2004 | Buda |
| 2005/0051270 | A1 | 3/2005 | Sasaki et al. |
| 2005/0093459 | A1 | 5/2005 | Kishinevsky |
| 2005/0135025 | A1 * | 6/2005 | Escoda ............ 361/42 |
| 2006/0011473 | A1 | 1/2006 | Kuriyama et al. |
| 2006/0100824 | A1 | 5/2006 | Moriya |
| 2006/0181816 | A1 * | 8/2006 | Pellon et al. ............ 361/5 |
| 2006/0213761 | A1 * | 9/2006 | Axenbeck et al. ........ 204/192.1 |
| 2007/0073498 | A1 * | 3/2007 | Winterhalter et al. ........ 702/64 |
| 2007/0121267 | A1 | 5/2007 | Kotani et al. |
| 2007/0251813 | A1 | 11/2007 | Ilic et al. |
| 2008/0121517 | A1 | 5/2008 | Nitschke |
| 2008/0121625 | A1 | 5/2008 | Zaehringer |
| 2008/0122369 | A1 | 5/2008 | Nitschke |
| 2008/0216745 | A1 * | 9/2008 | Wiedemuth et al. ..... 118/723 R |
| 2008/0218923 | A1 * | 9/2008 | Wiedemuth ............ 361/94 |
| 2008/0257869 | A1 | 10/2008 | Nitschke et al. |

FOREIGN PATENT DOCUMENTS

| | | |
|---|---|---|
| DE | 10034895 | 2/2002 |
| DE | 10119058 | 10/2002 |
| DE | 102004015090 | 11/2005 |
| DE | 102006002333 | 7/2007 |
| EP | 0713242 | 5/1996 |
| EP | 0 967 697 | 12/1999 |
| EP | 0 692 138 | 1/2004 |
| EP | 1 441 576 | 7/2004 |
| EP | 1705687 | 9/2006 |
| EP | 1720195 | 11/2006 |
| EP | 1 121 705 | 1/2009 |
| JP | 08-167500 | 6/1996 |
| JP | 08222398 | 8/1996 |
| JP | 2005077248 | 3/2005 |
| WO | WO 94/25977 | 11/1994 |
| WO | WO 01/13402 | 2/2001 |
| WO | WO 03/037047 | 5/2003 |
| WO | WO 03/088445 | 10/2003 |
| WO | WO 2006/014212 | 2/2006 |
| WO | WO 2006/116445 | 11/2006 |

OTHER PUBLICATIONS

Van Zyl et al., "Managing Arcs in RF Powered Plasma Processes", Society of Vacuum Coaters, 48th Annual Technical Conference Proceedings, 2005, pp. 44-49.

Zlatanovic et al., "Glow-to-Arc Transition Instability Sensor in Processing Plasma", Proc. 20th International Conference on Microelectronics, vol. 2, Sep. 12-14, 1995, pp. 597-600.

* cited by examiner

METHOD AND DEVICE FOR DETECTING ARCS

CROSS REFERENCE TO RELATED APPLICATION

This application claims priority under 35 U.S.C. §119(a) to European application number EP 05 028 145.0, filed Dec. 22, 2005, the entire contents of which are hereby incorporated by reference.

TECHNICAL FIELD

The invention relates to a method for detecting arcs in a plasma process that is supplied by an AC generator.

BACKGROUND

Coating of substances, e.g., glass surfaces, through sputtering/cathode sputtering in plasma processes, in a reactive and also conventional manner, is e.g., known from architecture glass coating. Towards this end, a current of voltage source generates a plasma that removes material from a target, which have been deposited on a substrate, e.g., a glass panel. Prior to depositing, the atoms may bind to gas atoms or gas molecules in a reactive process, depending on the desired coating.

Medium frequency (MF) generators are usually operated at a frequency of 10 to 500 kHz, and are often used, e.g., for reactive processes. The output voltage of MF generators is usually supplied to two electrodes in a plasma process chamber, and the two electrodes alternately work as a cathode and an anode and are each connected to one target. MF generators can operate at a freely oscillating frequency, or can operate at a fixed frequency.

In particular, in reactive processes, MF generators frequently also produce sparkovers, so-called micro arcs, that often automatically extinguish during the next voltage reversal or at least after a few periods. However, arcs of a higher energy and longer duration may also occur. Arcs are often detected by checking the output voltage of the generator for a voltage drop or by checking the output current of the generator for a current increase. An arc may alternatively be recognized by the difference between the currents to the individual electrodes. In conventional generators, the user can adjust an arc detection limit value. The effective values of the current and the voltage are measured for the detection. In such a measurement, the values of the voltage and current are integrated over the period in order to prevent zero crossings from being detected as voltage drops. This type of arc detection is therefore normally much slower than the duration of a half-wave of the MF output voltage, and therefore can be longer than 40 μs.

MF generators that are used in semiconductor production processes, e.g., in flat panel display (FPD) production processes, should be able to detect arc within a few μs or even less than one μs.

In the arc detection method disclosed in DE 43 26 100 A1, each half-wave of the medium frequency signal of the medium frequency generator is divided into a plurality of time periods, the values of current and voltage being measured for a predetermined time period for forming an actual value signal, and input into a ground-free measuring device. The measuring device is embedded in a loop whose master station is located in the control unit in the generator, and upon occurrence of an arc, the generator is disabled through a connecting line that connects the measuring device to the generator.

U.S. Pat. No. 6,420,863 B1 proposes measuring values of at least one discharge current or one discharge voltage for each half-wave. The difference between the measured values of a first and a second half-wave is established. The difference is compared with predetermined tolerances and, when the tolerances are exceeded, the power supply is reduced.

SUMMARY

On aspect of the invention features an arc detection method performed for a plasma process that is fed by an AC generator with an output signal of the AC generator for power supply. The method includes determining a time at which, as an evaluation signal, the output signal or a signal related to the output signal exceeds a reference value in a positive half-wave of the evaluation signal or falls below the reference value in a negative half-wave of the evaluation signal, and/or determining a subsequent time at which the evaluation signal falls below the reference value in the same half-wave in a positive half-wave of the evaluation signal or exceeds it in a negative half-wave of the evaluation signal. The method also includes determining at least one time interval using at least one of the times, and repeating these steps for a later half-wave of the evaluation signal. The method also includes comparing the mutually corresponding time intervals, and generating an arc detection signal when the mutually corresponding time intervals differ from each other by more than a predeterminable tolerance.

Even the smallest arcs can be reliably and quickly detected with such a method without erroneously interpreting voltage fluctuations, which are produced, e.g., by pressure changes in the plasma chamber, as arcs. This method also accelerates arc detection. Arcs can be detected, in particular, within a few microseconds or even faster, i.e., within less than one microsecond. This permits appropriate reaction to the detection of an arc to prevent damage, in particular, in the production of flat panel displays (FPD), and reduce the number of rejects. The output current, the output voltage or the output power of the AC generator may, e.g., be used as an evaluation signal. The output voltage is preferably monitored or the voltage that is directly applied to the electrodes is measured and used as an evaluation signal. It is also feasible to use an internal signal of the AC generator, in which the internal signal is related to the output signal, as an evaluation signal.

In some implementations, the time intervals for half-waves of the same polarity can be determined and compared. Different voltage curves can be generated through differing burning of the targets in a plasma process. Resulting fluctuations can be prevented from being interpreted as an arc by using half-waves of the same polarity for arc detection.

An erroneous reaction to fluctuations of the evaluation signal can be prevented in that the time intervals for directly successive half-waves of the same polarity can be determined and compared.

In some implementations, the time intervals to be compared can be formed as the difference between the successive times at which the reference value is exceeded or fallen below, and an arc detection signal can be generated when the time interval of the later half-wave is smaller than the corresponding time interval of the previous half-wave by more than a predeterminable tolerance. Thus, the time period between exceeding the reference value with a rising flank of a positive half-wave and falling below the reference value with the falling flank of the positive half-wave can be determined. In correspondence thereto, the time period between falling below the reference value with the falling flank and exceeding the reference value with the rising flank can be determined for a negative half-wave. When this time period for a later half-wave is shorter than the time period determined for the previous half-wave by more than the predeterminable tolerance, this is an indication of the presence of an arc. The overall tolerance can be composed of two different tolerance values at the start and at the end of the time period of time interval.

In some implementations, the time of zero crossing of the evaluation signal can be detected at the beginning of the half-wave, the time intervals to be compared can be formed as the difference between the time of an odd (first, third, etc.) exceeding or falling below (passage) of the reference value and the time of the zero crossing, and an arc detection signal can be generated when the time interval of the later half-wave is larger than the time interval of the previous half-wave by more than the predeterminable tolerance. This implementation can be implemented in a particularly simple manner in a programmable logic component.

Alternatively or additionally, the time of zero crossing of the evaluation signal can be detected at the beginning of the half-wave, the time intervals to be compared can be formed as the difference between the time of an even (second, fourth, etc.) exceeding or falling below (passage) of the reference value and the time of the zero crossing, and an arc detection signal can be generated when the time interval of the later half-wave is smaller than the time interval of the previous half-wave by more than the predeterminable tolerance.

The reliability of arc detection can be increased by ignoring one time interval in arc detection, when the time interval, which results as the difference between the time at which the reference value is exceeded or fallen below and the subsequent time at which the reference value is fallen below or exceeded, is below a predeterminable time period. Fluctuations of the evaluation signal that are not due to an arc, therefore remain unconsidered.

When several reference values are predetermined, arcs can be detected faster and with a higher accuracy.

In some implementations, an average amplitude value, which is averaged over several half-waves, is formed and the reference value(s) is/are predetermined in dependence on the average amplitude value. With this measure, the reference values are not rigidly predetermined but can be automatically adjusted to an evaluation signal that can gradually change during operation. The reference values are preferably selected as a percentage of the average amplitude value, e.g., 20, 40, 60, 80% of the average amplitude value.

In another general aspect, an arc detection means for arc detection in a plasma process includes at least one analog-to-digital converter (ADC) that is supplied with an evaluation signal (that can be the output signal or an internal signal of an AC generator which is related to the output signal), and with a reference value. The ADC is connected to a logic component that generates a signal for an arc suppression device. The advantage of the arc detection means is that the logic component generates the arc detection signal directly using the ADC signal without interconnecting a control means. This is much faster than would be possible by a control means, e.g., a microcontroller. Advantageously, the logic component is a programmable logic component. In the simplest case, the ADC consists of a comparator.

In some implementations, the logic component is designed as a field programmable gate array (FPGA).

In some implementations, the arc detection means includes a controller that presets the (parameter) values of the logic component. It is thereby possible to predetermine different parameter values such as, e.g., tolerances or the length of time intervals that are not taken into consideration for arc detection.

Depending on the process, it can be useful to preset different tolerances. To enable the user to do this, an operating field and a display can be associated with the controller.

Particularly fast and exact arc detection can be realized by providing several, e.g., four, comparators that are fed with different reference values. All of these comparators are connected to the programmable logic component.

In some implementations, the arc detection means includes reference value generating means, e.g., a voltage divider. An averaged average amplitude value of the evaluation signal can be supplied to the voltage divider. The comparators can tap into or receive the reference values between the resistances of the voltage divider. The reference values can be adjusted by the number and dimensioning of the resistances, in particular, as a percentage of the average amplitude value.

In one general aspect, an arc in a plasma process that is fed by an output signal of an AC generator can be detected with a method. The method includes determining a first time at which an evaluation signal passes a reference value in a first half-wave of the evaluation signal, determining a first time interval using the first time, and determining a second time at which the evaluation signal passes the reference value in a second half-wave of the evaluation signal and determining a second time interval using the second time. The method also includes comparing the mutually corresponding first and second time interval, and generating an arc detection signal if the mutually corresponding first and second time intervals differ from each other by more than a predeterminable tolerance.

Implementations can include one or more of the following features. For example, the method can include determining a subsequent first time at which the evaluation signal passes the reference value in the first half-wave of the evaluation signal. The determining the first time interval can include determining a time interval based on the first time and the subsequent first time.

The first half-wave can be a positive half-wave, and determining the first time at which the evaluation signal passes the reference value in the first half-wave can include determining the time at which the evaluation signal exceeds the reference value in the positive first half-wave.

The first half-wave can be a negative half-wave, and determining the first time at which the evaluation signal passes the reference value in the first half-wave can include determining the time at which the evaluation signal falls below the reference value in the negative first half-wave The method can include determining a subsequent second time at which the evaluation signal passes the reference value in the second half-wave of the evaluation signal. Determining the second time interval can include determining a time interval based on the second time and the subsequent second time.

The second half-wave can be a positive half-wave, and determining the second time at which the evaluation signal passes the reference value in the second half-wave can include determining the time at which the evaluation signal exceeds the reference value in the positive first half-wave.

The second half-wave can be a negative half-wave, and determining the second time at which the evaluation signal passes the reference value in the second half-wave can include determining the time at which the evaluation signal falls below the reference value in the negative first half-wave.

The first and second half-waves can have the same polarity. The first and second half-waves of the same polarity can be directly successive.

The method can include determining a first zero crossing time of the evaluation signal that occurs at the beginning of the first half wave and determining a second zero crossing time of the evaluation signal that occurs at the beginning of the second half wave.

The method can include receiving the evaluation signal. The evaluation signal can be related to the output signal of the AC generator. The evaluation signal can be determined from a measurement at the plasma process.

In another general aspect, an arc in a plasma process that is fed by an output signal of an AC generator is detected with a method. The method includes determining a first set of times at which an evaluation signal passes reference values in a first half-wave of the evaluation signal, determining a subsequent first set of times at which the evaluation signal passes the reference values in the first half-wave of the evaluation signal, determining first time intervals based on the first set of times and the subsequent first set of times, and determining a second set of times at which the evaluation signal passes the reference values in a second half-wave of the evaluation signal. The method also includes determining a subsequent second set of times at which the evaluation signal passes the reference values in the second half-wave of the evaluation signal, determining second time intervals based on the second set of times and the subsequent set of times, comparing the corresponding first and second time intervals, and generating an arc detection signal if any of the corresponding first and second time intervals differ from each other by more than a predeterminable tolerance T.

Implementations can include one or more of the following features. For example, determining the first time intervals can include determining the difference between the times at which a particular reference value is passed, and generating the arc detection signal can include generating the arc detection signal when any of the second time intervals is smaller than the corresponding first time interval by more than the predeterminable tolerance (T).

The method can include detecting the zero crossing time of the evaluation signal at the beginning of each of the first and second half-waves. The corresponding first and second time intervals to be compared can be formed as the difference between the odd time at which the evaluation signal passes the reference value and the zero crossing time, and the arc detection signal can be generated when any of the second time intervals is larger than the corresponding first time interval by more than the predeterminable tolerance (T).

The method can include detecting the zero crossing time of the evaluation signal at the beginning of each of the first and second half-waves. The corresponding first and second time intervals to be compared can be formed as the difference between the even time at which the evaluation signal passes the reference value and the zero crossing time, and the arc detection signal can be generated when any of the second time intervals is smaller than the corresponding first time interval by more than the predeterminable tolerance (T).

Generating the arc detection signal can include ignoring a time interval that is determined from the difference between a time of the first set of times and the subsequent time of the subsequent first set of times if the time interval is below a predeterminable time.

The method can include predetermining several reference values.

The method can include forming an average amplitude value (US) that is averaged over several half-waves. The reference values can be predetermined in dependence on the average amplitude value (UA).

In another general aspect, an arc detection means for detecting arcs in a plasma process, is designed for performing the method described above. The arc detection means includes at least one analog-to-digital converter (ADC) to which the evaluation signal and the reference value are supplied, and a logic component connected to the ADC to generate the arc detection signal for an arc suppression device.

Implementations can include one or more of the following features. For example, the arc detection means can include a controller that presets parametric values of the logic component. The arc detection means can include an operating field and a display associated with the controller. The arc detection means can include a comparator that is fed with the reference value. The arc detection means can include a reference value generating means. The reference value generating means can be a voltage divider.

The logic component can determine the time intervals and can store the time intervals in a buffer. The logic component can be connected to a clock generator that supplies the logic component with the clock signal.

The arc detection means can include a peak value rectifier.

Further features and advantages of the invention can be extracted from the following description of embodiments of the invention, the figures of the drawing which shows essential details of the invention, and the claims. The individual features may be realized individually or collectively in arbitrary combination in a variant of the invention.

The drawing schematically shows preferred embodiments of the invention which are explained below with reference to the figures of the drawing.

DETAILED DESCRIPTION

Figure 1:
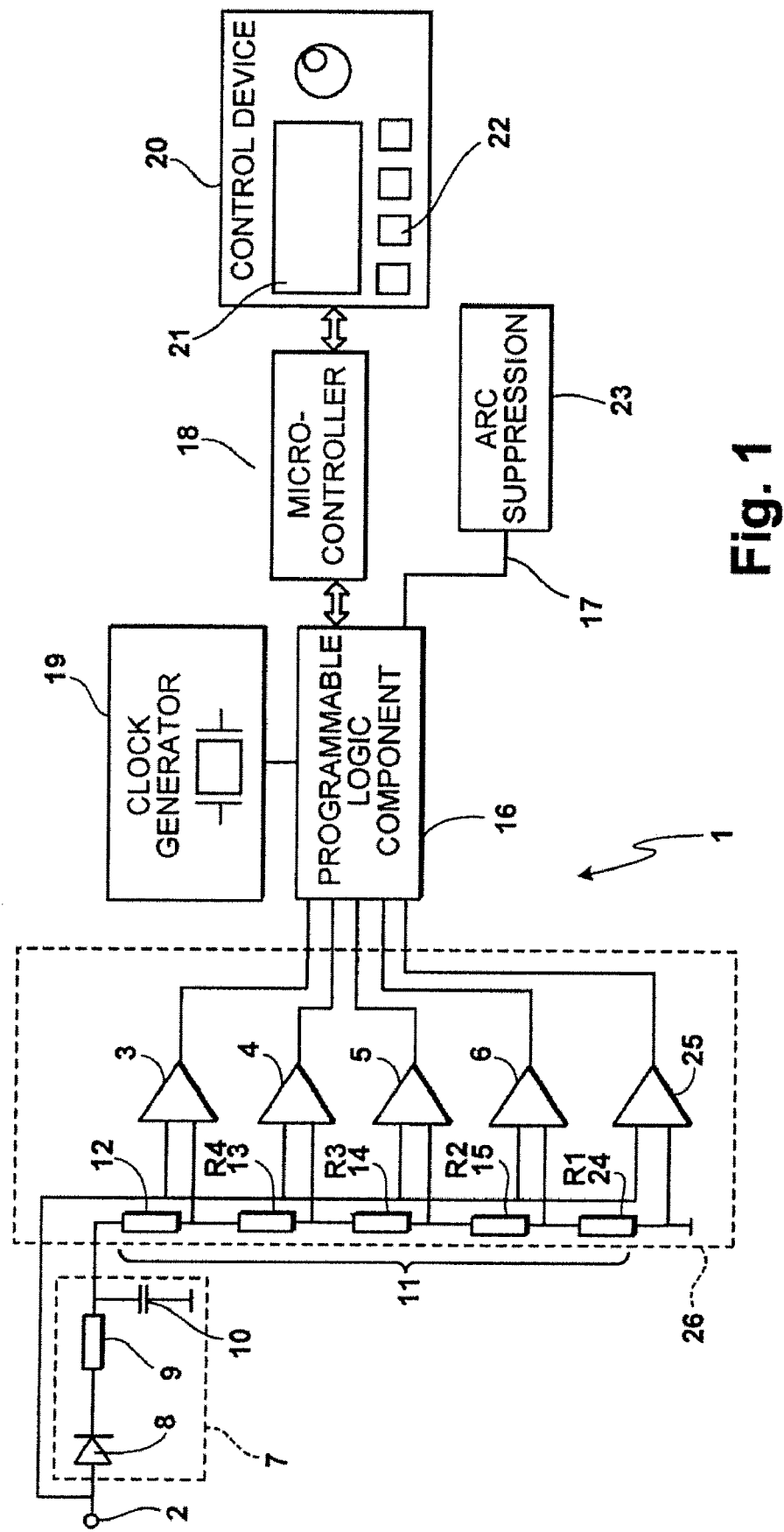
FIG. 1 is a schematic diagram of an arc detection means that receives an evaluation signal derived from an AC generator for a plasma process chamber.

FIG. 1 shows an arc detection means 1 that includes an input 2 that receives an evaluation signal that is derived from an AC generator that supplies power to a plasma process chamber or is derived from a measurement directly at the electrodes of the plasma process chamber. The arc detection means 1 also includes a circuit configuration 26 that includes analog-to-digital converters (ADCs) 3, 4, 5, 6, and 25 and a reference value generating means 11 that includes resistances 12, 13, 14, 15, and 24. The ADCs 3, 4, 5, 6, and 25 can be designed as comparators and the reference value generating means 11 can be designed as a voltage divider. The arc detection means 1 further includes a programmable logic component 16, a clock generator 19, a microcontroller 18, an arc suppression or arc deletion means 23, and a control device 20.

As mentioned, the evaluation signal may be derived from the AC generator, e.g., the evaluation signal may be the AC voltage generated by the AC generator, or an internal signal of the AC voltage generator. The instantaneous evaluation signal is applied to one input of each ADC 3, 4, 5, 6, 25. The evaluation signal is also supplied to a peak value rectifier 7 that includes a diode 8, a resistance 9, and a capacitance 10. The peak value rectifier 6 determines an amplitude UA that is averaged over several periods of the evaluation signal. In this case, the amplitude UA determined by the rectifier 7 is a voltage and the voltage amplitude UA is applied to the reference value generating means 11. The resistances 12, 13, 14, 15 of the reference value generating means 11 are all equally dimensioned. In this way, the same voltage drop is present at all resistances such that the averaged amplitude is divided into four voltages of equal values that are supplied to the ADCs 3 to 6 as reference values R1, R2, R3, and R4. The comparator 25 detects the zero crossing by comparing a reference value R5 with the instantaneous evaluation signal.

In other implementations, the reference value generating means 11 can be realized by an ADC. Such a design reduces the expense for the components. Moreover, the reference values, e.g., the reference voltages, can be adjusted even more finely. Moreover, an ADC can be used for the positive and negative half-waves of the evaluation signal, thus further reducing the number of components in, the cost of, and the required space for the circuit configuration 26.

In other implementations, an additional ADC can be provided for measuring the current that flows into the plasma process chamber. In this way, the current and voltage can be monitored by the arc detection means 1.

When an arc is present, the programmable logic component 16 issues a corresponding signal directly to the arc suppression or arc deletion means 23 through the line 17 without interconnecting the microcontroller 18 or the control device 20. The programmable logic component 16 is connected to the microcontroller 18 through which different parameter values can be present. Moreover, the programmable logic component 16 is connected to the clock generator 19, which permits rapid processing of information in the programmable logic component 16.

The microcontroller 18 is also connected to the subordinate control device 20 for data exchange. The control device 20 has a display 21 and an operating field 22 (a user interface) to enable programming of the microcontroller 18 and thereby the logic component 16.

Figure 2:
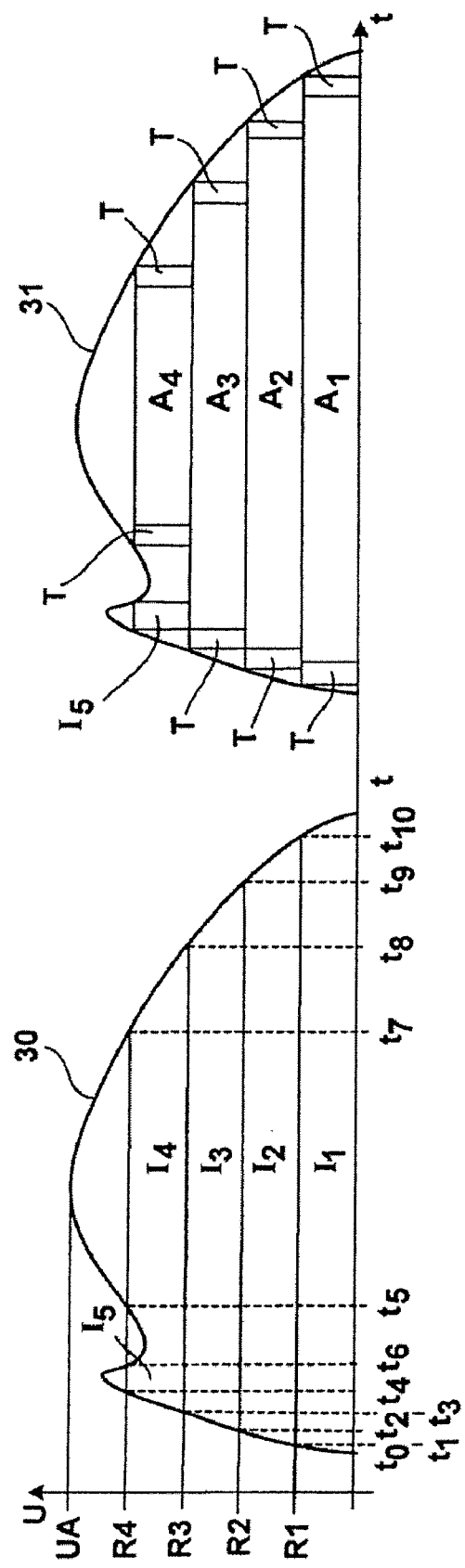
FIG. 2 is a graph of the evaluation signal versus time showing two positive half-waves.

FIG. 2 shows a first and a second (later in time) positive half-wave 30, 31 of an evaluation signal, which, in the example shown in FIG. 2, is the output voltage of an MF generator. The operation of the arc detection means 1 will be described with reference to FIG. 2. The comparators 3, 4, 5, and 6 compare the reference values R1, R2, R3, and R4, respectively, to the instantaneous evaluation signal from the input 2. The result of the comparison is supplied to the programmable logic component 16, which determines whether or not an arc is present in the plasma process chamber. The component 16 detects the time t1 at which the evaluation signal (in the positive half-wave 30) passes the reference value R1. The component 16 also detects the times t2 to t5 at which the evaluation signal (in the positive half-wave 30) passes the reference values R2, R3, R4. In particular, because the times t1, t2, t3, t4, and t5 are detected while the evaluation signal is rising, they are detected as the times at which the evaluation signal exceeds the respective reference values R1, R2, R3, R4.

Moreover, component 16 can also detect the times t6, t7, t8, t9, t10 at which the evaluation signal passes the reference values R1 to R4. In particular, because the times t6, t7, t8, t9, t10 are detected while the evaluation signal is falling, they are detected as the times at which the evaluation signal falls below the reference values R1-R4.

The evaluation signal exceeds the reference value R4 at an initial time t4 and at a second later time t5, and the evaluation signal falls below the reference value R4 at an initial time t6 and at a second time t7.

Time intervals formed for each reference value R1 to R4, and the time intervals can be dependent on at least some of the times t1-t10 and possibly time t0 (which is the time at the zero crossing). For example, time intervals I1-I5 can be formed by calculating the difference between, respectively, the times t10 and t1, the times t9 and t2, the times t8 and t3, the times t7 and t5, and the times t6 and t4. Alternatively or additionally, time intervals can be determined from the difference between the times t1-t10 and time t0 of the zero crossing (e.g., the time intervals t1-t0, t2-t0, etc.).

Each time interval determined in this fashion can be associated with a tolerance T. The same or different tolerances can be predetermined for all the reference values. The tolerances can be adjusted by the control device 20. The microcontroller 18 stores the adjusted values and passes them on to the logic component 16. The tolerances can be given in terms of fixed time values or parts of a half-wave, or a part of an interval I1 to I4. In some implementations, the tolerances can be given in terms of a percentage of the duration of the half-wave; in this way, the tolerances need not be entered again if the frequency of the evaluation signal changes. In some implementations, the tolerances can be 10 to 20% of the duration of the half-wave for I1 to I3 and 20 to 35% of the duration of the half-wave for I4. It is also feasible to predetermine different tolerance values for the start and the end of a time interval, as shown for the second half-wave 31 shown in FIG. 2. In this case, all reference values can have the same preset first tolerance value for the beginning and the same second tolerance value for the end of the time intervals I1-I5, the second being larger than the first tolerance value. If the half-wave 31 is within these locations marked with T or outside thereof, then the programmable logic component 16 determines that an arc is not present. If the half-wave 31 is within one of the regions A1 to A4, then the programmable logic component 16 determines that an arc is present.

The length of the time interval I5 is smaller than a predeterminable minimum time period. For this reason, this time interval I5 is not taken into consideration for arc detection. The minimum time period can be adjusted by the control device 20. The microcontroller 18 stores the adjusted value and passes it on to the logic component 16. The minimum time period can be given in terms of a fixed time value or a part of a half-wave. In some implementations, the minimum time period can be given in terms of a percentage of the duration of the half-wave; in this way, the minimum time period need not be entered again if the frequency of the evaluation signal changes. Typical values of the minimum time period are between 10% and 20% of the duration of the half-wave for I1 to I3, and 5% to 15% of the duration of the half-wave for I4.

As mentioned above, the time intervals can be determined from the difference between the times t1-t10 and the time t0 of the zero crossing alternatively or additionally to formation of the time intervals I1 to I4 or the time intervals A1 to A4 (which are the time intervals I1-I4, respectively, reduced by the respective tolerances). A first tolerance can be predetermined for the times t1 to t5 with the rising portion of the half-wave 30 (the same for all reference values or a different one for one or more, in particular, all reference values). If the first tolerance is exceeded, e.g., because the time interval t1-t0 of the half-wave 31 is larger than the time interval t1-t0 of the half-wave 30 by more than the predetermined tolerance, an arc is detected. In order to use the correct times for evaluation, the logic component 16 takes into consideration that the times t1, t2, t3, t4 represent the times at which the respective reference value is initially exceeded (for a positive half-wave) or fallen below (for a negative half-wave) in each half-wave, and the time t5 is the third passage of the reference value R4. In this analysis, the times of the odd passages of the respective reference value are used.

An arc can be detected by taking into consideration the time intervals formed by the times t6 to t10 of the falling flank of the half-wave 30. A second tolerance can thereby be predetermined for the times t6 to t10 with the falling portion of the half-wave 30 (the same for all reference values or a different one for one or more, in particular, for each reference value). If the second tolerance is fallen below, e.g., if the time interval t10-t0 of the half-wave 31 is smaller than the time interval t10-t0 of the half-wave 30 by more than the predetermined tolerance, an arc is detected. In order to ensure that the correct times are used for evaluation, the logic component 16 takes into consideration that the times t6, t8, t9, t10 are the second time the respective reference value is exceeded or fallen below in each half-wave, and time t7 is the fourth passage of the reference value R4. In this analysis, the times of the even passages of the respective reference value are used.

It is clear that when it is checked whether the second half-wave 31 has a shape that would substantiate an arc, the times t0-t10 can, at the same time, be detected again for this half-wave, such that this half-wave can be compared again with the subsequent half-wave.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method for detecting an arc in a plasma process that is fed by an output signal of an AC generator, the method comprising:
    determining a first time at which an evaluation signal passes a first reference value in a first half-wave of the evaluation signal;
    determining a subsequent first time at which the evaluation signal passes a second reference value in the first half-wave of the evaluation signal, the first time and subsequent first time defining a first time interval;
    determining a second time at which the evaluation signal passes the first reference value in a second half-wave of the evaluation signal;
    determining a subsequent second time at which the evaluation signal passes the second reference value in the second half-wave of the evaluation signal, the second time and the subsequent second time defining a second time interval;
    comparing the first and second time intervals; and
    generating an arc detection signal if the first and second time intervals differ from each other by more than a predeterminable tolerance.

2. The method of claim 1, wherein the first reference value and the second reference value are the same.

3. The method of claim 1, wherein the first reference value corresponds to a zero-crossing.

4. The method of claim 1, wherein the first half-wave is a positive half-wave, and determining the first time and the subsequent first time at which the evaluation signal passes the first and second reference values, respectively, in the first half-wave includes determining a time at which the evaluation signal exceeds the first and second reference values, respectively, in the positive first half-wave.

5. The method of claim 1, wherein the first half-wave is a negative half-wave, and determining the first time and the subsequent first time at which the evaluation signal passes the first and second reference values, respectively, in the first half-wave includes determining a time at which the evaluation signal falls below the first and second reference values, respectively, in the negative first half-wave.

6. The method of claim 1, wherein the second half-wave is a positive half-wave, and determining the second time and the subsequent second time at which the evaluation signal passes the first and second reference values, respectively, in the second half-wave includes determining a time at which the evaluation signal exceeds the first and second reference values, respectively, in the positive first half-wave.

7. The method of claim 1, wherein the second half-wave is a negative half-wave, and determining the second time and the subsequent second time at which the evaluation signal passes the first and second reference values, respectively, in the second half-wave includes determining a time at which the evaluation signal falls below the first and second reference values, respectively, in the negative first half-wave.

8. The method of claim 1, further comprising determining a first zero crossing time of the evaluation signal that occurs at the beginning of the first half wave and determining a second zero crossing time of the evaluation signal that occurs at the beginning of the second half wave.

9. The method of claim 1, further comprising receiving the evaluation signal.

10. The method of claim 1, wherein the evaluation signal is related to the output signal of the AC generator.

11. The method of claim 1, wherein the evaluation signal is determined from a measurement at the plasma process.

12. The method of claim 1, wherein the first and second half-waves have the same polarity.

13. The method of claim 12, wherein the first and second half-waves of the same polarity are directly successive.

14. A method for detecting an arc in a plasma process that is fed by an output signal of an AC generator, the method comprising:
    determining a first set of times at which an evaluation signal passes reference values in a first half-wave of the evaluation signal,
    determining a subsequent first set of times at which the evaluation signal passes the reference values in the first half-wave of the evaluation signal,
    determining first time intervals based on the first set of times and the subsequent first set of times,
    determining a second set of times at which the evaluation signal passes the reference values in a second half-wave of the evaluation signal,
    determining a subsequent second set of times at which the evaluation signal passes the reference values in the second half-wave of the evaluation signal,
    determining second time intervals based on the second set of times and the subsequent set of times,
    comparing the corresponding first and second time intervals, and
    generating an arc detection signal if any of the corresponding first and second time intervals differ from each other by more than a predeterminable tolerance T.

15. The method of claim 14, wherein:
    determining the first time intervals includes determining the difference between the times at which a particular reference value is passed, and
    generating the arc detection signal includes generating the arc detection signal when any of the second time intervals is smaller than the corresponding first time interval by more than the predeterminable tolerance (T).

16. The method of claim 14, further comprising detecting the zero crossing time of the evaluation signal at the beginning of each of the first and second half-waves, wherein the corresponding first and second time intervals to be compared are formed as the difference between the odd time at which the evaluation signal passes the reference value and the zero crossing time, and the arc detection signal is generated when any of the second time intervals is larger than the corresponding first time interval by more than the predeterminable tolerance (T).

17. The method of claim 14, further comprising detecting the zero crossing time of the evaluation signal at the beginning of each of the first and second half-waves, wherein the corresponding first and second time intervals to be compared are formed as the difference between the even time at which the evaluation signal passes the reference value and the zero crossing time, and the arc detection signal is generated when any of the second time intervals is smaller than the corresponding first time interval by more than the predeterminable tolerance (T).

18. The method of claim 14, wherein generating the arc detection signal includes ignoring a tune interval that is determined from the difference between a time of the first set of times and the subsequent time of the subsequent first set of times if the time interval is below a predeterminable time.

19. The method of claim 14, further comprising predetermining several reference values.

20. The method of claim 14, further comprising forming an average amplitude value (UA) that is averaged over several half-waves, wherein the reference values are predetermined in dependence on the average amplitude value (UA).

21. An arc detector comprising:
  at least one analog digital converter (ADC) to which an evaluation signal and a reference value are supplied; and
  a logic component coupled to the ADC and configured to receive a result based on a comparison between the evaluation signal and the reference value;
  wherein the arc detector is configured to:
    determine a first time at which the evaluation signal passes a first reference value in a first half-wave of the evaluation signal and a subsequent first time at which the evaluation signal passes a second reference value in the first half-wave of the evaluation signal, the first time and subsequent first time defining a first time interval; and
    determine a second time at which the evaluation signal passes the first reference value in a second half-wave of the evaluation signal and a subsequent second time at which the evaluation signal passes the second reference value in the second half-wave of the evaluation signal, the second time and subsequent second time defining a second time interval; and
  wherein the logic component is configured to generate an arc detection signal for an arc suppression device responsive to a difference between the first and second time intervals being more than a predeterminable tolerance.

22. The arc detector of claim 21, wherein the ADC is configured as a comparator.

23. The arc detector of claim 21, wherein the logic component determines the first and second time intervals and stores the first and second time intervals in a buffer.

24. The arc detector of claim 21, wherein the logic component is connected to a clock generator that supplies the logic component with a clock signal.

25. The arc detector of claim 21, further comprising a controller that presets parametric values of the logic component.

26. The arc detector of claim 25, further comprising an operating field and a display associated with the controller.

27. The arc detector of claim 21, further comprising a reference value generator coupled to the ADC and configured to supply the reference value to the ADC.

28. The arc detector of claim 27, wherein the reference value generator is a voltage divider.

29. The arc detector of claim 27, further comprising a peak value rectifier coupled to the reference value generator and configured to supply the reference value generator with an average amplitude of the reference signal.

* * * * *

UNITED STATES PATENT AND TRADEMARK OFFICE
CERTIFICATE OF CORRECTION

PATENT NO. : 7,640,120 B2
APPLICATION NO. : 11/612655
DATED : December 29, 2009
INVENTOR(S) : Sven Axenbeck et al.

It is certified that error appears in the above-identified patent and that said Letters Patent is hereby corrected as shown below:

In claim 18, column 11, line 17, delete "tune" and insert --time--.

In claim 21, column 11, line 27, delete "detector" and insert --detector,--.

Signed and Sealed this

Twentieth Day of April, 2010

David J. Kappos
*Director of the United States Patent and Trademark Office*